United States Patent
Tsividis (10) Patent No.: US 10,234,512 B2
(45) Date of Patent: Mar. 19, 2019

(54) CURRENT-BASED CELL MODELING

(71) Applicant: Sendyne Corporation, New York, NY (US)

(72) Inventor: Yannis Tsividis, New York, NY (US)

(73) Assignee: Sendyne Corporation, New York, NY (US)

( * ) Notice: Subject to any disclaimer, the term of this patent is extended or adjusted under 35 U.S.C. 154(b) by 407 days.

(21) Appl. No.: 14/564,464

(22) Filed: Dec. 9, 2014

(65) Prior Publication Data

US 2015/0094972 A1 Apr. 2, 2015

Related U.S. Application Data

(63) Continuation-in-part of application No. 13/515,754, filed as application No. PCT/US2012/041948 on Jun. 11, 2012, now abandoned.

(Continued)

(51) Int. Cl.
*G06F 17/50* (2006.01)
*G01R 31/367* (2019.01)
(Continued)

(52) U.S. Cl.
CPC .......... *G01R 31/367* (2019.01); *B60L 3/0046* (2013.01); *B60L 3/12* (2013.01);
(Continued)

(58) Field of Classification Search
None
See application file for complete search history.

(56) References Cited

U.S. PATENT DOCUMENTS 5,428,560 A * 6/1995 Leon ...................... G01R 31/36
136/200
5,658,682 A * 8/1997 Usuda ................... H01M 10/48
324/431

(Continued)

FOREIGN PATENT DOCUMENTS

JP      2010266439 A    11/2010
KR  10-2006-0107535 A   10/2006

(Continued)

OTHER PUBLICATIONS

MOSFET Modeling for Analog Circuit CAD: Problems and Prospects. Yannis P. Tsividis, Fellow, IEEE, and Ken Suyama, Member, IEEE. IEEE Journal of Solid-State Circuits, Vol. 29, No. 3, March 1994.

(Continued)

*Primary Examiner* — Kibrom K Gebresilassie
(74) *Attorney, Agent, or Firm* — Oppedahl Patent Law Firm LLC (57) ABSTRACT

An arrangement provides simulation of important battery factors such as state of charge or state of health, and the estimates are provided to the human user in ways that permit the human user to make better use of the battery, for example in an electric car. The arrangement is made up in part of nodes, each individually simulated, and at least some of the nodes communicate with each other by means of values which within the domain of the simulator are understood as currents but which may have real-world significance for some value that is not a current at all. The currents are passed on a (simulated) analog bus. Some lines on the analog bus, while understood as "currents" in the domain of the simulator, are actually values that merely pass messages between modeling elements, the "current" values not nec- (Continued)

essarily representing any real-life measurable such as the aforementioned temperature value.

23 Claims, 11 Drawing Sheets

Related U.S. Application Data (60) Provisional application No. 61/495,986, filed on Jun. 11, 2011, provisional application No. 61/914,813, filed on Dec. 11, 2013.

(51) Int. Cl.
| | |
|---|---|
| *B60L 3/00* | (2019.01) |
| *B60L 3/12* | (2006.01) |
| *B60L 11/18* | (2006.01) |
| *H01M 10/42* | (2006.01) |
| *G01R 19/165* | (2006.01) |
| *H01M 10/48* | (2006.01) |
| *H02J 7/00* | (2006.01) |
| *H01M 10/625* | (2014.01) |
| *G01R 31/28* | (2006.01) |
| *G01R 31/392* | (2019.01) |

(52) U.S. Cl.
CPC ....... *B60L 11/1857* (2013.01); *B60L 11/1861* (2013.01); *G06F 17/5036* (2013.01); *B60L 2240/545* (2013.01); *B60L 2240/547* (2013.01); *B60L 2240/549* (2013.01); *G01R 19/16542* (2013.01); *G01R 31/2848* (2013.01); *G01R 31/392* (2019.01); *H01M 10/4257* (2013.01); *H01M 10/486* (2013.01); *H01M 10/625* (2015.04); *H02J 7/008* (2013.01); *H02J 7/0022* (2013.01); *H02J 7/0091* (2013.01); *Y02T 10/7005* (2013.01); *Y02T 10/705* (2013.01); *Y02T 10/7044* (2013.01); *Y02T 90/16* (2013.01)

(56) References Cited

U.S. PATENT DOCUMENTS

| | | | | |
|---|---|---|---|---|
| 6,016,047 | A * | 1/2000 | Notten | G01R 31/3651 320/128 |
| 6,160,382 | A | 12/2000 | Yoon et al. | |
| 6,225,782 | B1 * | 5/2001 | Mercer | H02J 7/0072 320/125 |
| 6,441,586 | B1 | 8/2002 | Tate, Jr. et al. | |
| 6,909,261 | B2 | 6/2005 | Laig-Horstebrock et al. | |
| 6,910,143 | B2 | 6/2005 | Odaohhara et al. | |
| 7,109,685 | B2 * | 9/2006 | Tate, Jr. | G01R 31/3624 320/132 |
| 7,321,220 | B2 * | 1/2008 | Plett | G01R 31/361 320/116 |
| 7,358,701 | B2 * | 4/2008 | Field | B60L 3/12 320/104 |
| 7,542,858 | B2 | 6/2009 | Horning et al. | |
| 7,593,821 | B2 * | 9/2009 | Plett | H01M 10/42 320/132 |
| 7,827,007 | B2 * | 11/2010 | Ito | H02J 7/0063 702/183 |
| 7,994,755 | B2 * | 8/2011 | Plett | G01R 31/3624 320/132 |
| 8,008,891 | B2 | 8/2011 | Yun et al. | |
| 8,392,043 | B2 | 3/2013 | Koprubasi | |
| 8,449,998 | B2 * | 5/2013 | Koetting | H01M 10/48 429/50 |
| 8,670,885 | B2 * | 3/2014 | Gilman | B60W 50/0097 340/425.5 |
| 8,880,253 | B2 * | 11/2014 | Li | B60W 10/26 320/132 |
| 9,321,368 | B2 * | 4/2016 | Yang | B60L 11/1861 |
| 9,678,164 | B2 * | 6/2017 | Mitsuyama | H01M 10/48 |
| 2003/0236656 | A1 | 12/2003 | Dougherty | |
| 2004/0032264 | A1 * | 2/2004 | Schoch | G01R 31/3668 324/426 |
| 2004/0212367 | A1 | 10/2004 | Dougherty | |
| 2005/0046389 | A1 | 3/2005 | Kim | |
| 2006/0097698 | A1 * | 5/2006 | Plett | H02J 7/0021 320/118 |
| 2006/0100833 | A1 * | 5/2006 | Plett | H01M 10/48 703/2 |
| 2006/0132097 | A1 * | 6/2006 | Chiang | G01R 35/005 320/150 |
| 2007/0035307 | A1 | 2/2007 | Schoch | |
| 2007/0236182 | A1 * | 10/2007 | Plett | G01R 31/3651 320/132 |
| 2007/0299620 | A1 | 12/2007 | Yun et al. | |
| 2008/0238430 | A1 | 10/2008 | Page et al. | |
| 2009/0037124 | A1 | 2/2009 | Majima | |
| 2009/0295397 | A1 | 12/2009 | Barsukov | |
| 2010/0036627 | A1 | 2/2010 | Bergveld et al. | |
| 2010/0085057 | A1 | 4/2010 | Nishi et al. | |
| 2010/0153038 | A1 | 6/2010 | Tomura et al. | |
| 2010/0174499 | A1 | 7/2010 | Kang et al. | |
| 2010/0191491 | A1 | 7/2010 | Plett | |
| 2010/0301813 | A1 | 12/2010 | Esnard et al. | |
| 2010/0323279 | A1 | 12/2010 | Fujiuchi et al. | |
| 2011/0054816 | A1 | 3/2011 | Prada et al. | |
| 2011/0156644 | A1 * | 6/2011 | Arai | B60L 3/0046 320/109 |
| 2011/0161025 | A1 | 6/2011 | Tomura et al. | |
| 2012/0101674 | A1 | 4/2012 | Wang et al. | |
| 2012/0112685 | A1 | 5/2012 | Hartley et al. | |
| 2012/0119746 | A1 | 5/2012 | Macris | |
| 2012/0143411 | A1 | 6/2012 | Koprubasi et al. | |
| 2012/0179420 | A1 * | 7/2012 | Gilman | B60K 35/00 702/165 |
| 2012/0191390 | A1 | 7/2012 | Kang et al. | |
| 2012/0239233 | A1 | 9/2012 | Koprubasi | |
| 2013/0151227 | A1 * | 6/2013 | Yang | H01M 10/48 703/18 |
| 2013/0179135 | A1 * | 7/2013 | Kang | B60L 11/1842 703/8 |
| 2013/0185008 | A1 | 7/2013 | Itabashi et al. | |
| 2013/0282353 | A1 * | 10/2013 | Tsividis | G06F 17/5036 703/18 |
| 2013/0307572 | A1 * | 11/2013 | Yu | G01R 31/00 324/750.03 |
| 2015/0292464 | A1 * | 10/2015 | Maeda | F02N 11/0825 290/38 E |
| 2017/0028866 | A1 * | 2/2017 | Miller | B60L 11/1861 |
| 2017/0075522 | A1 * | 3/2017 | Kim | G06F 3/0482 |

FOREIGN PATENT DOCUMENTS

| | | |
|---|---|---|
| KR | 10-2008-0000160 A | 1/2008 |
| KR | 10-2009-0043890 A | 5/2009 |
| WO | 2013095885 A1 | 6/2013 |

OTHER PUBLICATIONS

Impedance-based non-linear dynamic battery modeling for automotive applications. Stephan Buller, Marc Thele, Eckhard Karden, Rik W. De Doncker. Journal of Power Sources 113 (2003) 422-430.
International Search Report dated Feb. 26, 2013 in PCT/US12/41948.
Written Opinion dated Feb. 26, 2013 in PCT/US12/41948.
Stephan Buller et al., "Impedance-based non-linear dynamic battery modeling for automotive applications," 2003, Journal of Power Sources, vol. 113, pp. 422-430.
U.S. Appl. No. 14/604,627, filed Jan. 23, 2015.
International Search Report for PCT/IB2012/050270, dated Sep. 7, 2012.

(56) References Cited

OTHER PUBLICATIONS

Written Opinion of the International Searching Authority for PCT/IB2012/050270, dated Sep. 7, 2012.

* cited by examiner

$V_{TEMP} = f_S(V_{ILOAD}, V_{AMB\_TEMP})$

CURRENT-BASED CELL MODELING

BACKGROUND

It is not easy simulating a battery. Off-the-shelf simulation tools are not as much help as one might think. One can pick some real-life parameters that one thinks may be helpful in the simulation, and the off-the-shelf simulation tool may not be able to simulate all of the parameters.

Successful simulation of a battery can permit predicting, in advance, the service life of a proposed battery in a proposed application. Thus for example there may be empirical measurements as for a particular cell that may serve as a building block for a battery that has not yet been built. It may be desired to predict the service life for the not-yet-built battery in a particular application. Or it may be desired to predict the number of charge/discharge cycles that are likely to be available from the not-yet-built battery.

In addition to simulation of a not-yet-built battery, it can be very helpful to arrive at an estimate of state of charge or state of health for an actual battery in actual service. A successful (that is, accurate) estimate of state of charge would, in an electric car, permit a successful estimate of the traveling distance available to the driver before the battery runs out. In contrast an unsuccessful estimate can lead to a very disappointed user if the battery runs out sooner than expected, thereby stranding the user. Or an unsuccessful estimate can lead to a failure to take advantage of the full capacity of the battery, for example unnecessarily forgoing a particular diversion when the diversion would, in fact, have been possible to the user.

Likewise a successful estimate of the state of health of the battery permits planning. For example if the system correctly estimates that the state of health is poor, the user can arrange for a battery replacement and thus can avoid getting stranded somewhere due to battery failure. If on the other hand the system arrives at an inaccurate estimate, the user could schedule a wholly unneeded battery replacement session, wasting time and losing use of the vehicle during the trip to and from the service location. Alternatively the user could end up stranded somewhere due to a failure to estimate the (poor) state of health of the battery.

It will come as no surprise that many investigators have expended enormous amounts of time and energy attempting to develop simulation tools which might help with these real-life tasks. It will also come as no surprise that to date, no approach known to the applicant has worked out well. A successful approach would likely be "compact" as the term is used in the world of simulation, meaning among other things that it can be done with only modest computational expense while providing reasonably accurate simulation results.

International patent publication WO 2012/173937 A2 (published Dec. 20, 2012) and US patent publication US 20130282353 A1 (published Oct. 24, 2013), filed by the present applicant and inventor, discuss earlier approaches to the difficult problem of simulating battery conditions. As described there, a battery simulator is made up in part of nodes, each individually simulated, and the nodes communicate with each other by means of values which within the domain of the simulator are understood as voltages but which may have real-world significance for some value that is not a voltage at all.

SUMMARY OF THE INVENTION

An arrangement provides simulation of important battery factors such as state of charge or state of health, and the estimates are provided to the human user in ways that permit the human user to make better use of the battery, for example in an electric car. The arrangement is made up in part of nodes, each individually simulated, and at least some of the nodes communicate with each other by means of values which within the domain of the simulator are understood as currents but which may have real-world significance for some value that is not a current at all. The currents are passed on a (simulated) analog bus. Some lines on the analog bus, while understood as "currents" in the domain of the simulator, are actually values that merely pass messages between modeling elements, the "current" values not necessarily representing any real-life measurable such as the aforementioned temperature value.

DESCRIPTION OF THE DRAWING

The invention will be explained with respect to a drawing in several figures, of which.

DETAILED DESCRIPTION

Figure 1:
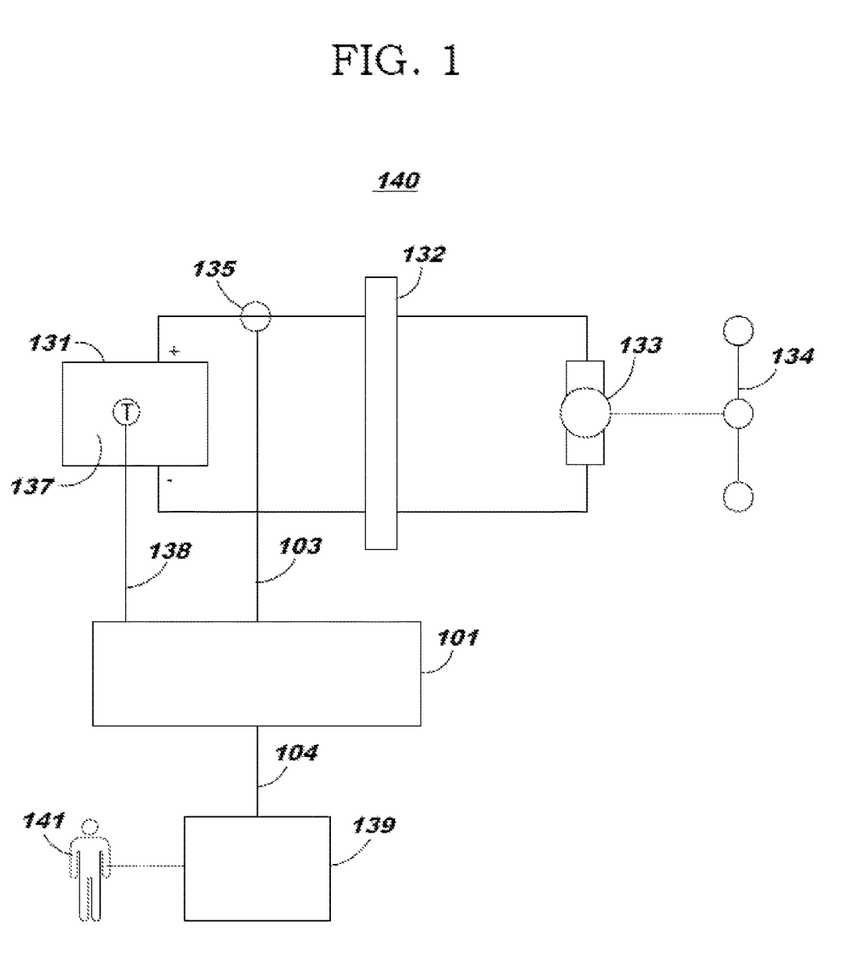
FIG. 1 shows a battery simulator in a system with a battery and a load and a human user.

FIG. 1 shows a battery simulator 101 in a system 140 with a battery 131 and a load 133, 134 and a human user 141. An exemplary system is an electric car. In the electric car, a controller 132 permits selective coupling of the battery 131 with an electric motor 133 which is mechanically coupled to wheels 134. A battery simulator 101 provides signal line 104 to a display 139 which helps the user 141 make decisions about the operation of the car. Inputs to the simulator 101 include a temperature signal 138 from temperature sensor 137 and current signal 103 from current sensor 135.

It should be appreciated that the signal line 104 to display 139 is exemplary but the invention is not limited to the use of a single signal line 104. In the examples given here signal line 104 may be indicative of the distance that the car is estimated to be able to travel given the present state of charge of the battery 131. The simulator 101 may, however, provide other signals such as predicted time to end of life for the battery 131, or predicted time to a recommended maintenance interval.

It should likewise be appreciated that the input lines 103, 138 are exemplary but the invention is not limited to the use of those particular inputs. Many other inputs may be appropriate in particular applications, for example voltage readings from individual cells of the battery 131, or number of charge/discharge cycles that have taken place in the past for this particular battery 131.

Figure 2:
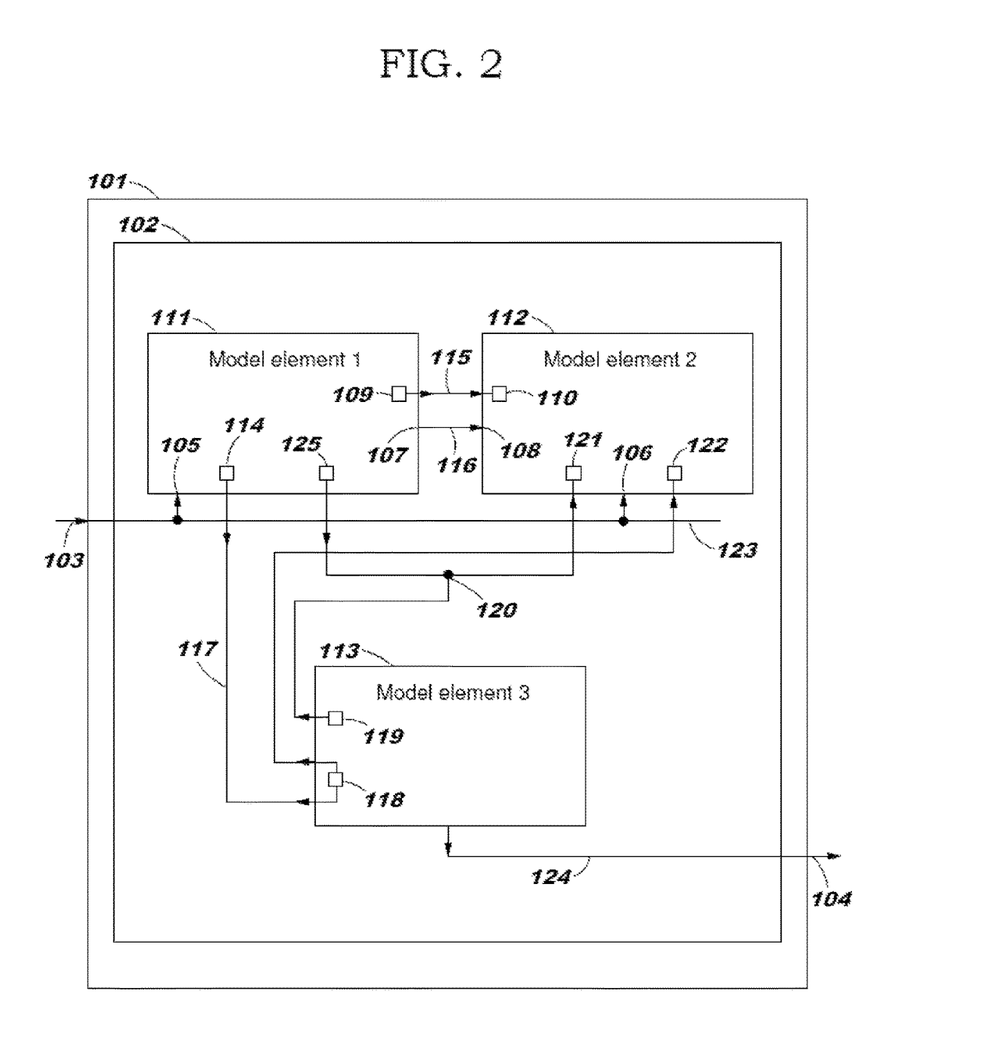
FIG. 2 shows a battery simulator made up of a circuit simulator employing current signaling.

The battery simulator 101 of FIG. 1 is shown in more detail in FIG. 2. FIG. 2 shows a battery simulator 101 made up of a circuit simulator 102 employing current signaling. A discussion of FIG. 2 will permit the alert reader to appreciate that the system and approach according to the invention provide what might be most clearly described as a simulator within a simulator. Box 101 is a battery simulator, which receives real-world information on exemplary line 103 about a real-world battery (omitted for clarity in FIG. 2) and which provides information at line 104 that is intended to be of real-world significance to a human user (likewise omitted for clarity in FIG. 2).

The "simulator within a simulator" aspect of FIG. 2 will now be discussed in greater detail.

Simulator 101 is physically visible to a person viewing a system 140 as in FIG. 1. It is a physical device for example located somewhere in an electric car. Simulator 101 has inputs such as 103 and outputs such as 104.

Within simulator 101 is a circuit simulator 102. The circuit simulator 102 uses computation to arrive at a simulation of a virtual circuit, the circuit selected and designed by a designer with a goal that that virtual circuit, when simulated, mimics (simulates) the real-world behavior of a real-world battery (such as battery 131 in FIG. 1). The circuit simulator 102 in a laboratory or development setting will likely be a general-purpose computer running circuit simulation software such as Spice. In a production or consumer environment such as an electric car, the circuit simulator 10 will likely be an embedded system. The embedded system may be an ASIC (application-specific integrated circuit) fabricated to provide a microcontroller or microprocessor with suitable firmware along with appropriate interface circuitry. The embedded system may be an off-the-shelf or customized microcontroller with suitable firmware and appropriate configuration of general-purpose input-output pins. In any event the computer or microprocessor or microcontroller is, among other things, carrying out a circuit simulation in which modelling elements are simulated, about which more will be said momentarily.

Returning to FIG. 2, the circuit simulator 102 within the battery simulator 101 in turn contains a plurality of modeling elements being individual circuits each of which is simulated within the circuit simulator 102. In FIG. 2 what is shown are three exemplary modeling elements 111, 112, and 113. Each of these modeling elements is (virtually) an electronic circuit. Each (modeled) electronic circuit, that is to say, each modeling element, is interesting of course only to the extent that it somehow connects with something else. The "something else" to which a modeling element connects may be one or more other modeling elements, or may be the "outside world" from the point of view of the circuit simulator 102. In the terminology employed in FIG. 2, the "outside world" from the point of view of circuit simulator 102 is not the system 140 (of FIG. 1) but is merely the battery simulator 101. It is the battery simulator 101 which maps real-world signals such as 103 and 104 to signals within the domain of the circuit simulator 102, for example signal lines 123 and 124 respectively.

The alert reader will thus appreciate that values within the domain of the circuit simulator 102 such as voltage values or current values might in some instances correspond to real-world values outside of the battery simulator 101, but that in general this is not the case and should not be assumed. Some of the values within the domain of the circuit simulator 102 will likely have no particular real-world significance and may instead serve merely as "message passing" mechanisms between modeling elements 111, 112, and 113.

One of the insights of this invention, then, is to use a traditional electrical circuit simulator, such as Spice. The real-life parameters to be simulated are mostly voltage values at electrical lines, plus one or more physical measurables at physical locations, such as temperature. A related insight is to find ways to map the real-world values to (virtual) voltages and currents within the domain of the circuit simulator. These "voltages" and "currents" are each a proxy for a physical measurable such as temperature of something at some physical location. The information is thus passed from one modeling element to the next, as if it were a voltage or current being passed from one electrical line to the next.

To carry out this approach, we start by choosing key variables, on which model parameters depend such as SOC (state of charge), ILOAD (load current), temperature, number of cycles, age). We then represent each with a voltage or current: Vsoc or Isoc, VILOAD or IILOAD, VTEMP or ITEMP, VCYCLES or ICYCLES, VAGE or IAGE, etc. We then place them on a bus or on interconnects. We then connect modeling elements to the bus and interconnects as needed.

For this to work, clearly one must devise virtual circuits that serve to simulate the state of affairs (so far as temperature and other physical measurables is concerned) at each of several locations. Each virtual circuit, when simulated in the circuit simulator 102, will, it is hoped, contribute to a successful simulation of the battery 131 (FIG. 1).

Figure 10:
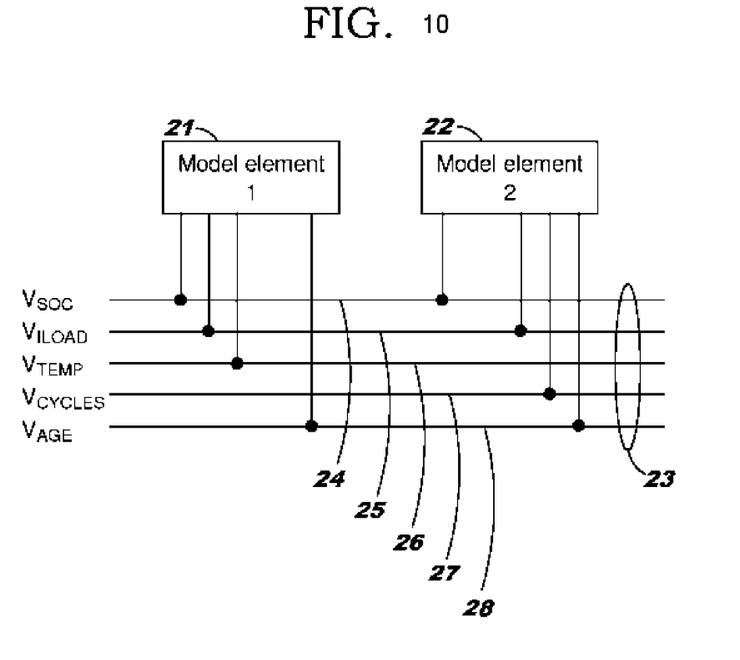
FIG. 10 shows two modeling elements connected to an analog bus according to the invention.

FIG. 10 shows two modeling elements connected to an analog bus according to the invention in the simple case in which signaling is carried out by means of voltages. The modeling elements 21 and 22 communicate by means of analog bus 23, which is composed of analog lines 24-28. In this example line 24 is a voltage indicative of state-of-charge of a cell, the voltage being the result of the simulation. Line 25 is the load current measured by means of a current measurement device in series with the cell. (The current measurement device is omitted for clarity in FIG. 10.) Line 26 is a voltage indicative of a simulated temperature in the cell. Line 27 is a voltage indicative of the number of charge-discharge cycles that have happened during the life of the cell. Line 28 is a voltage indicative of the age of the cell.

The reader will appreciate that these lines represent values which may be very helpful in simulation of the state of the cell, but that other values may likewise prove helpful in such simulation. The invention should not be understood as limited to the particular values shown in the analog bus 23 of FIG. 10.

Figure 11:
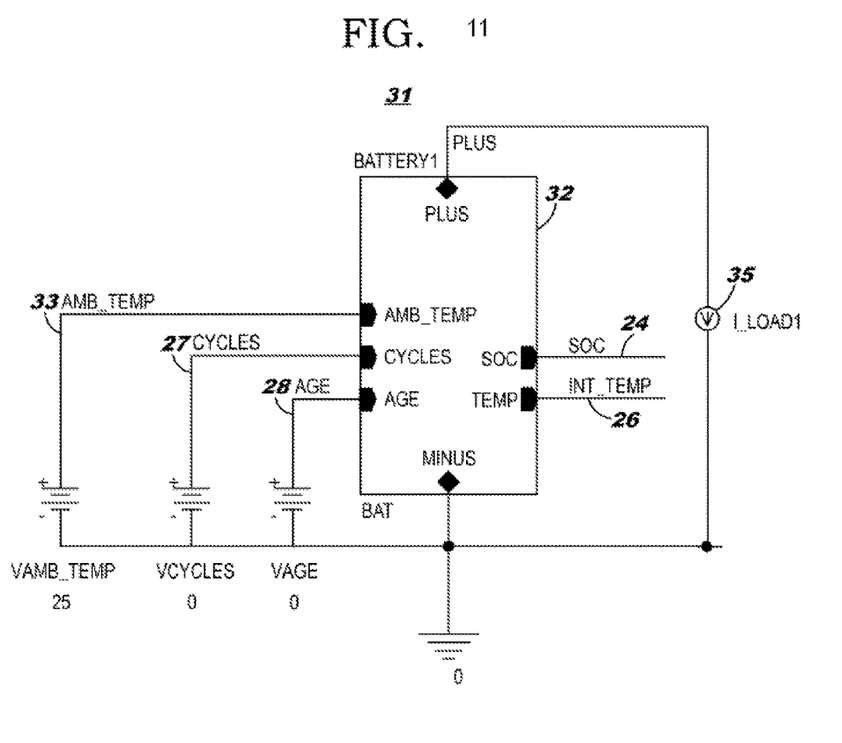
FIG. 11 shows a battery module with external inputs and various test loads.

FIG. 11 shows a battery simulation module 32 with external inputs and various test loads. Inputs to the simulation module 32 include the number-of-cycles value at 27 and the age value at 28. The simulated (estimated) state-of-charge value is at 24. Test load 35 is provided for purposes of the simulation.

Figure 3:
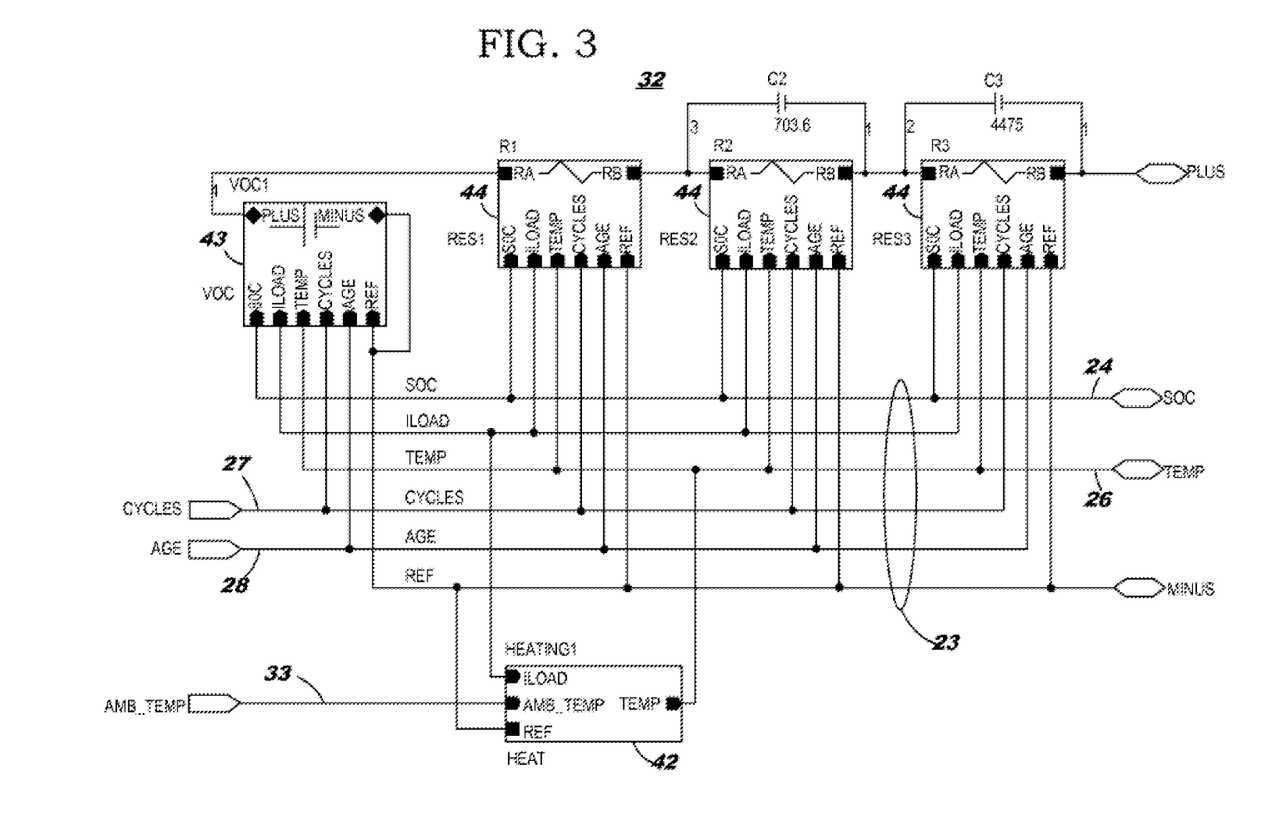
FIG. 3 shows a battery module simulated by means of modeling elements.

FIG. 3 shows the battery module 32 in greater detail, simulated by means of modeling elements. Inputs to module 32 include the previously mentioned age and cycles values, and outputs include the state-of-charge value. Within the simulated battery module 32 are exemplary modeling elements such as element 42, which models temperature (heat generation) within a cell, element 43 which models the open-circuit voltage of the cell, and elements 44 which model resistive elements in the model of the cell. These various modeling elements communicate with each other by means of the analog bus 23.

Figure 4:
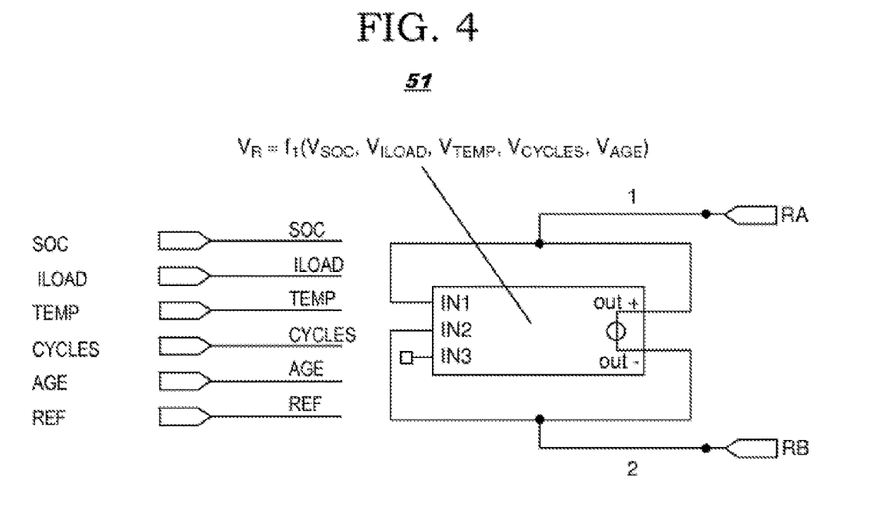
FIG. 4 shows a modeling element for internal resistance in a model of a cell that includes a modeled internal resistance.

FIG. 4 shows a modeling element for internal resistance in a model of a cell that includes a modeled internal resistance.

It should be appreciated by the reader that although a particular functional relationship is set forth in FIG. 4, based upon a guess as to the dependence of cell internal resistance upon the number of cycles and upon the state-of-charge, the invention is not to be understood as limited to this particular functional relationship. Thus for example the functional relationship that might turn out to yield better results might take more or fewer inputs or different inputs. Finally, the some other selection or arrangement of modeling elements could well turn out to model some cell more accurately than the selection or arrangement of modeling elements depicted herein.

Figure 5:
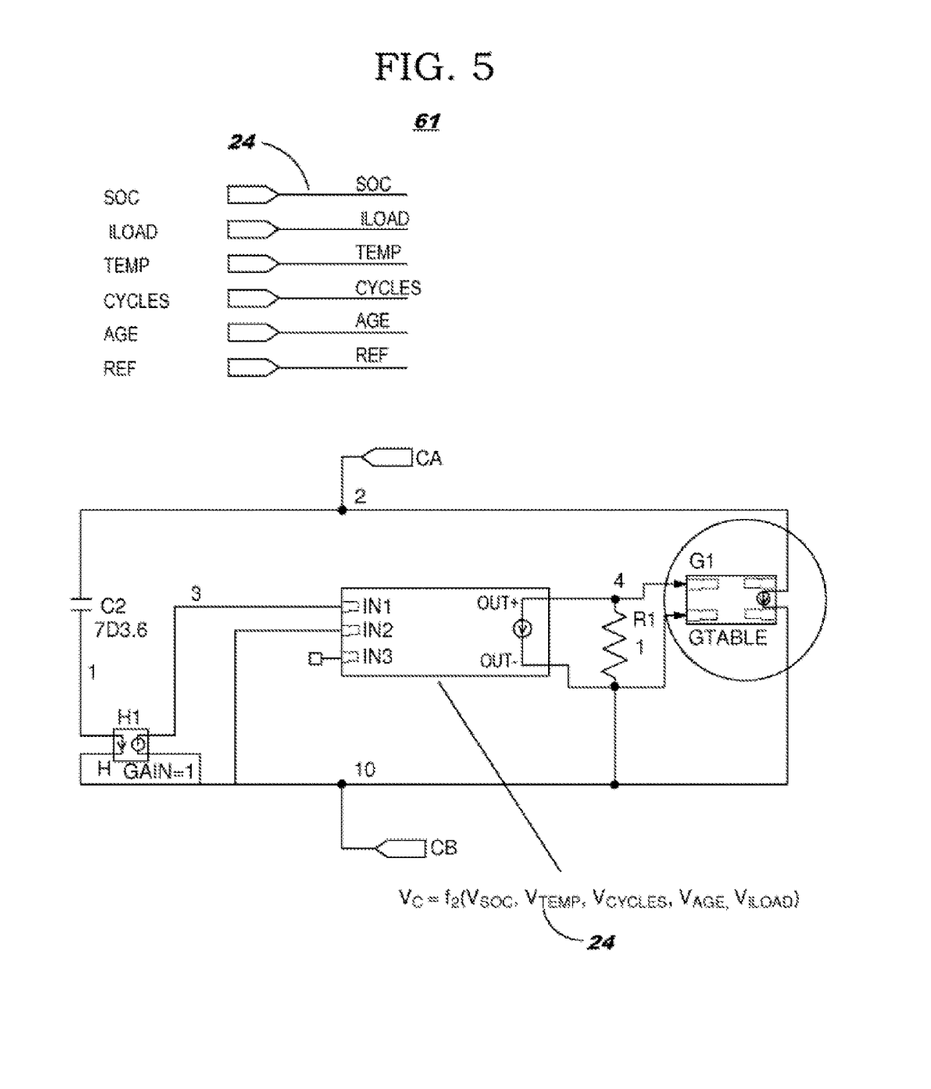
FIG. 5 shows a modeling element for capacitance in a model of a cell that includes a modeled capacitance.

FIG. 5 shows a modeling element 61 for capacitance in a model of a cell that includes a modeled capacitance. The element 61 takes as input (among other things) the signal from the analog bus called SOC which is line 24.

Figure 6:
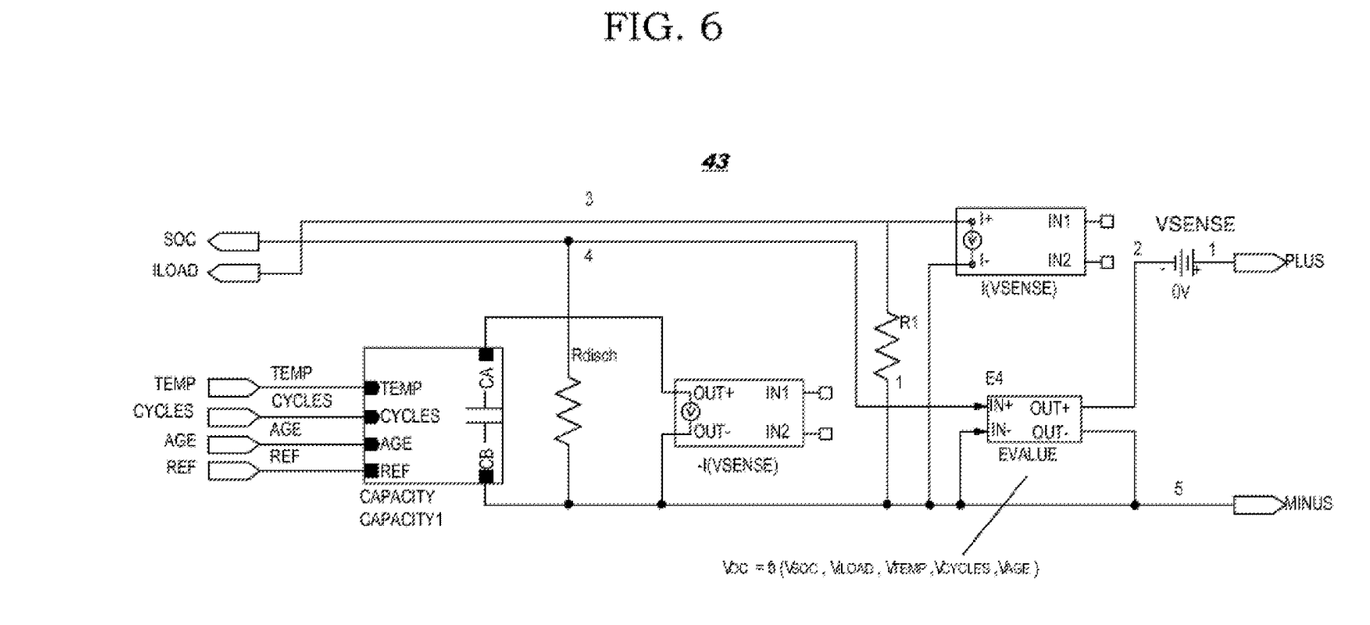
FIG. 6 shows a modeling element for open-circuit voltage of a cell in a model of a cell that includes a modeled open-circuit voltage.

FIG. 6 shows a modeling element 43 for open-circuit voltage of a cell in a model (FIG. 3) of a cell that includes a modeled open-circuit voltage. Again a particular functional relationship is assumed for a particular cell being modeled, but some other relationship may turn out in particular cases to offer better results.

Figure 7:
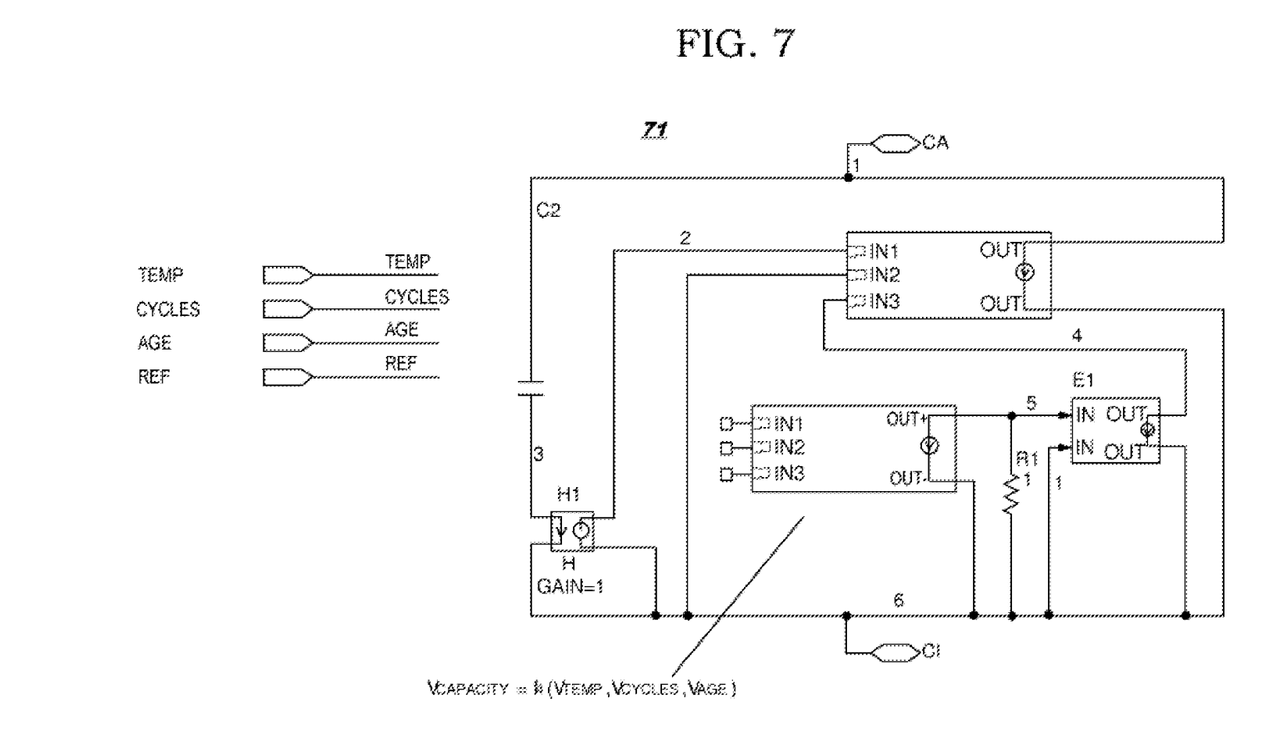
FIG. 7 shows a modeling element for an electrochemical storage capacity of a cell in a model of a cell that includes a modeled electrochemical storage capacity.

FIG. 7 shows a modeling element 71 for an electrochemical storage capacity of a cell in a model of a cell that includes a modeled electrochemical storage capacity.

Figure 8:
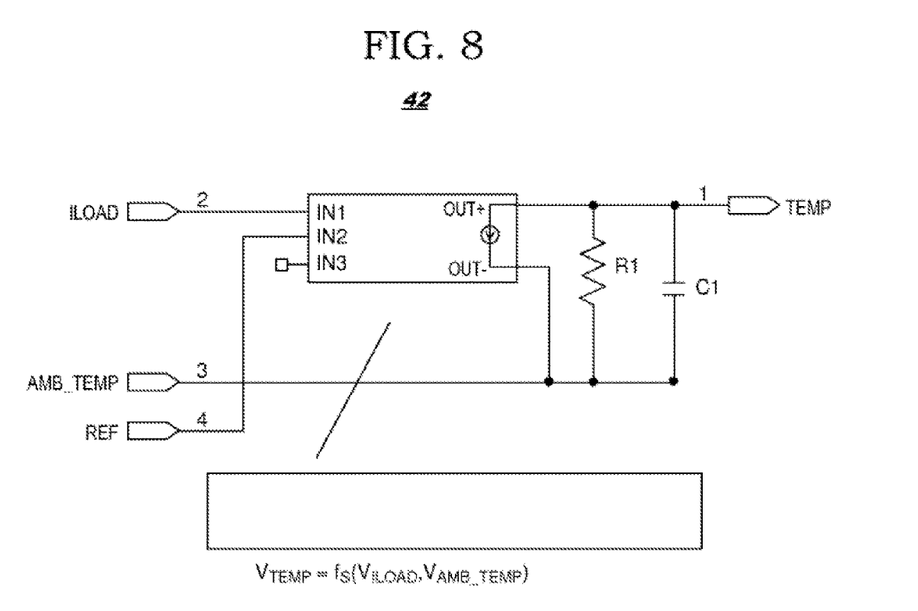
FIG. 8 shows a modeling element for a heat generation in a cell in a model of a cell that includes a modeled heat generation.

FIG. 8 shows a modeling element 42 for a heat generation in a cell in a model of a cell that includes a modeled heat generation.

Figure 9:
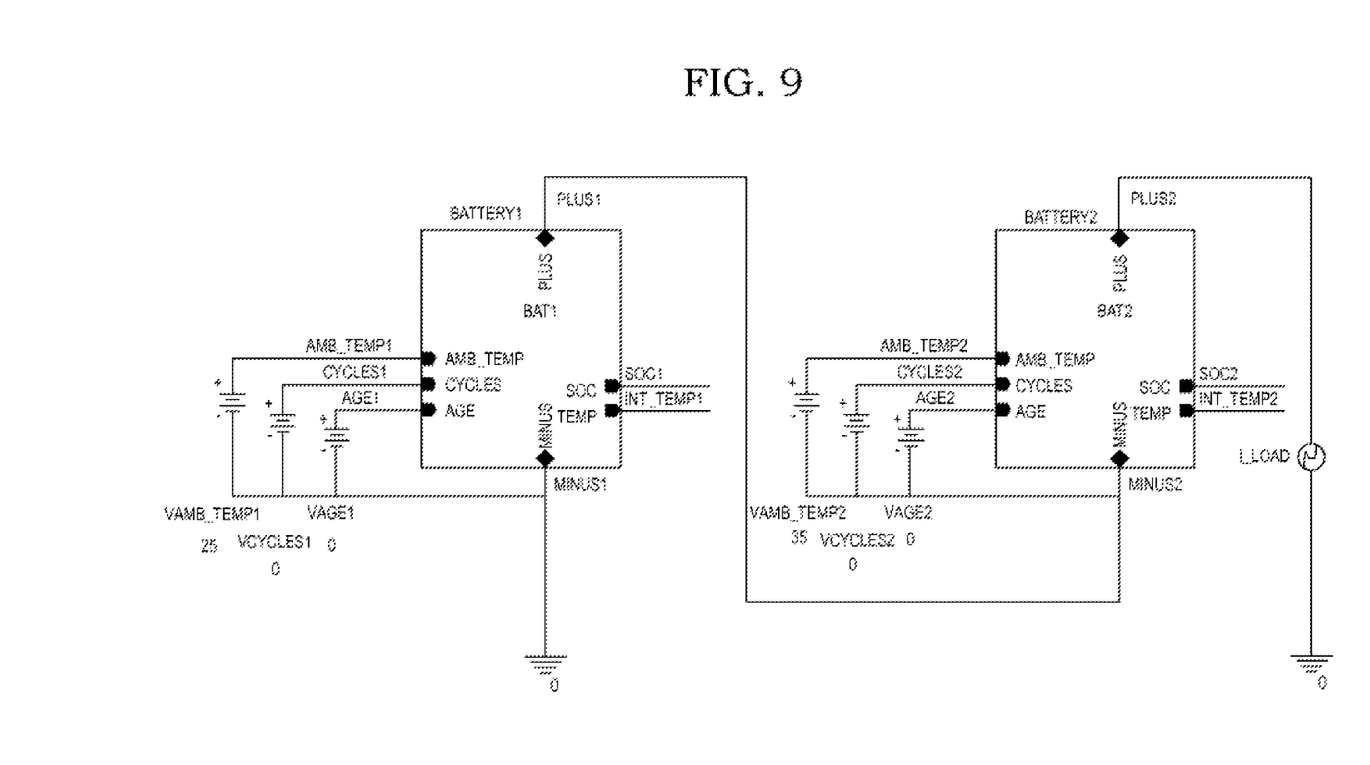
FIG. 9 shows a model of two cells in series, each of the cells modeled by its own modeling elements such as previously discussed.

FIG. 9 shows a model of two cells in series, each of the cells modeled by its own modeling elements such as previously discussed. It will be appreciated that each (modeled) cell has its own analog bus with voltages representing such things as age of the cell, number of cycles for the cell, the (modeled) temperature of the cell, and the (modeled) state-of-charge of the cell.

Returning now to FIG. 2, it will be recalled that the present invention requires signaling between modeling elements 111, 112, and 113. The present invention makes use of current signaling and in this respect differs from the above-mentioned international patent publication WO 2012/173937 A2 and US patent publication US 20130282353 A1 which made use of voltage signaling. The current signaling will need to be explained.

By way of background to the current signaling, the voltage signaling will be reviewed. With voltage signaling, the circuit simulation assumes a (virtual) low-impedance driver such as 107 in FIG. 2, and a (virtual) high-impedance input such as 108 in FIG. 2, connected by a (virtual) electrical connection 116. This kind of signaling can "fan out" in the sense that the line 116 could split at a "Y" junction and could connect to two or more high-impedance inputs at two or more modeling elements. In this way the information communicated by the driver 107 could reach two or more modeling elements.

Turning now from the voltage signaling, the current signaling may be described by some examples in FIG. 2. With current signaling, there might be a (virtual) current source 109 connected by a (virtual) electrical conductor 116 to a (virtual) current sensor 110.

The (virtual) current value on (virtual) line 116 may be indicative of a real-life current somewhere in the real-world system 140. Alternatively the virtual current on virtual line 116 may represent some other real-world measurable thing that is not a current at all. Finally the virtual current on virtual line 116 may not represent any real-world thing but may simply be the signaling of some message between one modeling element and another modeling element, all within the domain of the circuit simulator.

How does one accomplish "fan out" with current signaling? The straightforward way to do this may be seen in an example in FIG. 2. A virtual current source 114 emits a current communicated along virtual line 117 to modeling element 113. The modeling element 113 contains a (virtual) current sensor 118 which measures the virtual current. The (virtual) circuit being simulated further defines a conductor path by which current passes from current sensor 118 to current sink 122 where it is measured within modeling element 112.

This way of accomplishing "fan out" has what might seem like a drawback, requiring two "pins" on signaling element 113. Normally any design approach that uses up two "pins" where one might have sufficed is a non-negligible drawback. With a microcontroller having only a limited number of GPIO pins, this uses up a pin and might force the designer to migrate up to a physically larger microcontroller with more pins. Here of course the extra pin is only a virtual pin in a virtual circuit element in a simulated circuit, and so is not necessarily a substantial drawback.

The use of current signaling (by which is meant signaling by virtual currents in a simulated circuit) offers other potential benefits. For example suppose each of two modeling elements is emitting virtual current indicative of some measured real-world current, or indicative of an estimated current at some real-world location at which it is not possible to measure the current. Suppose further that the real-world system is such that the real-world currents are expected to add up according to Kirchhof's Law. In the simulation, these two virtual currents may thus conveniently be added in a corresponding way.

An example of this is shown in FIG. 2. Virtual current source 125 in modeling element 111 sources a current. Virtual current source 119 in modeling element 113 also sources a current. The currents (which are virtual currents) merge at node 120, and pass to virtual current sink 121 at modeling element 112. This provides a straightforward way to permit the circuit being simulated to mimic the real-life phenomena being modeled for example in system 140 in FIG. 1.

As for the voltage signaling, the advantages of the bus approach described here include the ability to adding new dependency variables as desired; this is done by simply adding a line to the bus. The bus approach also permits adding another dependency to a given element; one simply connects the element to the corresponding bus line. Such a change does not increase the number of lines. The bus approach is thus modular and is battery-type-independent.

In this modeling approach, modeling elements such as those in FIG. 2 can have:

main terminals for connection to the rest of the model;

inputs, for receiving information on the variables that affect them;

outputs, for providing information on their internal conditions.

It is better not to use grounds within modules, as these can interfere with each other when the modules are combined.

As described above, one disclosed embodiment is a software circuit simulator such as Spice or Pspice, in which each of the modeling elements is modeled by the software circuit simulator shown at 102 in FIG. 2.

Still another approach is to replace the circuit simulator 102 of FIG. 2 with actual physical circuits, the circuits connected by means of the interconnections described. Still another approach is a hybrid approach that takes the place of circuit simulator 102 in FIG. 2, with some modeling elements modeled by the software circuit simulator and others provided as actual circuits. Through any of these approaches, one of the insights is the use of an analog bus having some lines representing real-world voltages, other lines representing physical parameters (such as temperature) being modeled, and still other lines perhaps representing "hidden variables", namely values passed between modeling elements that are not known to the system designer to represent physical measurables but that nonetheless contribute to a better simulation and thus a better estimate of the real-world state being estimated.

The approach of the invention arrives at an estimate of a state of a battery 131 (FIG. 1) having at least first and second electrical terminals, and communicates the estimate to a human user 131 (FIG. 1) through an appropriate display device 129 (FIG. 1). The battery 131 has at least a current measurement device 135 in series therewith. The battery 131 has at least a first temperature sensor 137. A number of interconnects are provided between modeling elements (111, 112, 113 in FIG. 2) as defined within the inventive system as discussed above. Each modeling element connects to at least interconnects. For at least one of the interconnects, one of the modeling elements drives it with a current source, and a second one of the modeling elements receives current by means of a current sink.

The typical battery states to be estimated may include state-of-charge or state-of-health but may also include other states or other measurables.

Those skilled in the art will have no difficulty devising myriad obvious variants and improvements upon the invention, all of which are intended to be encompassed within the claims which follow.

The invention claimed is:

1. A method for arriving at an estimate of a state of a battery having first and second terminals, the battery delivering a first current to a load through a current sensor having an output, the battery further having a temperature sensor having an output, the method comprising the steps of:
providing a processor, the processor associated with a memory device;
programming the memory device to perform a battery simulation, the battery simulation comprising a circuit simulator and a plurality of modeling elements, thereby creating a battery simulator;
receiving the output of the current sensor at an input of at least one of the modeling elements within the battery simulator;
receiving the output of the temperature sensor at an input of at least one of the modeling elements within the battery simulator;
at a first one of the modeling elements within the circuit simulator, sourcing a second current having a current value;
at a second one of the modeling elements within the circuit simulator, sinking the second current;
within the battery simulator, arriving at the estimate of the state of the battery based upon at least the output of the current sensor, the output of the temperature sensor, and the value of the second current, and communicating the estimate of the state of the battery externally from the battery simulator, whereby the estimate of the state of the battery is applied to operation of the load.

2. The method of claim 1 wherein the battery and load further comprise an electric car, and wherein the estimate of the state of the battery comprises an estimated available driving distance, the method further comprising the step of communicating the estimated available driving distance to a human user.

3. The method of claim 1 wherein at least one of the modeling elements is a simulated circuit within a circuit simulator within the battery simulator.

4. The method of claim 3 wherein at least one of the modeling elements is a physical circuit within the battery simulator.

5. The method of claim 1 wherein at least one of the modeling elements is a physical circuit within the battery simulator.

6. The method of claim 5 wherein at least one of the modeling elements is a simulated circuit within a circuit simulator within the battery simulator.

7. The method of claim 3 wherein at least two of the modeling elements are simulated circuits within the circuit simulator within the battery simulator.

8. The method of claim 7 wherein every one of the modeling elements is a simulated circuit within the circuit simulator within the battery simulator.

9. The method of claim 1 further comprising the steps of:
at a third one of the modeling elements within the battery simulator, sourcing a voltage having a voltage value;
at a fourth one of the modeling elements within the battery simulator, sensing the voltage;
wherein the step of arriving at the estimate of the state of the battery is further based upon the value of the voltage.

10. The method of claim 1 further comprising the steps of:
at a third one of the modeling elements within the battery simulator, receiving the second current prior to its arrival at the second modeling element, within the third one of the modeling elements within the battery simulator, measuring its value, and passing the second current along to the second modeling elements where it is sinked.

11. The method of claim 1 further comprising the steps of:
at a third one of the modeling elements within the battery simulator, sourcing a third current;
at a node between the current source of the first one of the modeling elements within the battery simulator and the current sink of the second one of the modeling elements within the battery simulator, summing the third current and the second current;
whereby the current sinked at the current sink of the second one of the modeling elements within the battery simulator is the sum of the third current and the second current.

12. Apparatus for arriving at an estimate of a state of a battery having first and second terminals, the battery delivering a first current to a load through a current sensor having an output, the battery further having a temperature sensor having an output, the comprising:
- a processor associated with a memory device, the memory device comprising a battery simulation program, the battery simulation program comprising a circuit simulator and a plurality of modeling elements, thereby creating a battery simulator apparatus;
- at least one of the modeling elements within the battery simulator receiving the output of the current sensor;
- at least one of the modeling elements within the battery simulator receiving the output of the temperature sensor;
- a current source within a first one of the modeling elements within the battery simulator, sourcing a second current having a current value;
- a current sink within a second one of the modeling elements within the battery simulator;
- a conductor connecting the current source with the current sink, whereby the current sink sinks the second current;
- an output from the battery simulator indicative of an estimate of the state of the battery based upon at least the output of the current sensor, the output of the temperature sensor, and the value of the second current, the output communicated externally from the battery simulator.

13. The apparatus of claim 12 wherein the battery and load further comprise an electric car, and wherein the estimate of the state of the battery comprises an estimated available driving distance, the apparatus further comprising a display communicating the estimated available driving distance to a human user.

14. The apparatus of claim 12 wherein the battery simulator further comprises a circuit simulator, and wherein at least a first one of the modeling elements is a simulated circuit within the circuit simulator within the battery simulator.

15. The apparatus of claim 14 wherein at least a second one of the modeling elements is a physical circuit within the battery simulator.

16. The apparatus of claim 12 wherein at least a first one of the modeling elements is a physical circuit within the battery simulator.

17. The apparatus of claim 16 wherein the battery simulator further comprises a circuit simulator, and wherein at least a second one of the modeling elements is a simulated circuit within the circuit simulator within the battery simulator.

18. The apparatus of claim 14 wherein at least a second one of the modeling elements is also a simulated circuit within the circuit simulator within the battery simulator.

19. The apparatus of claim 18 wherein everyone of the modeling elements is a simulated circuit within the circuit simulator within the battery simulator.

20. The apparatus of claim 12 further comprising:
- a voltage source within a third one of the modeling elements within the battery simulator, sourcing a voltage having a voltage value;
- a voltage sensor within a fourth one of the modeling elements within the battery simulator, sensing the voltage;
- wherein the output from the battery simulator indicative of an estimate of the state of the battery is further based upon the value of the voltage.

21. The apparatus of claim 12 further comprising:
a second current sensor within a third one of the modeling elements within the battery simulator, the second current sensor receiving the second current prior to its arrival at the second modeling element, the second current being passed along to the second modeling elements where it is sinked.

22. The apparatus of claim 12 further comprising:
- a third current source within a third one of the modeling elements within the battery simulator; and
- a node between the current source of the first one of the modeling elements within the battery simulator and the current sink of the second one of the modeling elements within the battery simulator, said node summing the third current and the second current;
- whereby the current sinked at the current sink of the second one of the modeling elements within the battery simulator is the sum of the third current and the second current.

23. A method for arriving at an estimate of a state of a battery having first and second terminals, the battery delivering a first current to a load through a current sensor having an output, the battery further having a temperature sensor having an output, the method comprising the steps of:
- providing a processor, the processor associated with a memory device;
- programming the memory device to perform a battery simulation, the battery simulation comprising a circuit simulator and a plurality of modeling elements, thereby creating a battery simulator;
- receiving the output of the current sensor at an input of at least one of the modeling elements within the battery simulator;
- receiving the output of the temperature sensor at an input of at least one of the modeling elements within the battery simulator;
- at a first one of the modeling elements within the circuit simulator, sourcing a second current having a current value;
- at a second one of the modeling elements within the circuit simulator, sinking the second current;
- wherein at least one of the modeling elements is a simulated circuit within the circuit simulator within the battery simulator;
- within the battery simulator, arriving at the estimate of the state of the battery based upon at least the output of the current sensor, the output of the temperature sensor, and the value of the second current, and communicating the estimate of the state of the battery externally from the battery simulator, whereby the estimate of the state of the battery is applied to operation of the load.

* * * * *